(12) United States Patent
Hsueh et al.

(10) Patent No.: US 7,692,501 B2
(45) Date of Patent: Apr. 6, 2010

(54) PHASE/FREQUENCY DETECTOR AND CHARGE PUMP ARCHITECTURE FOR REFERENCELESS CLOCK AND DATA RECOVERY (CDR) APPLICATIONS

(75) Inventors: Yu-Li Hsueh, Mountain View, CA (US); Miaobin Gao, Saratoga, CA (US); Chien-Chang Liu, Sunnyvale, CA (US)

(73) Assignee: Intel Corporation

( * ) Notice: Subject to any disclaimer, the term of this patent is extended or adjusted under 35 U.S.C. 154(b) by 103 days.

(21) Appl. No.: 11/855,857

(22) Filed: Sep. 14, 2007

(65) Prior Publication Data

US 2009/0074123 A1 Mar. 19, 2009

(51) Int. Cl.
*G01R 23/06* (2006.01)
*H03D 13/00* (2006.01)

(52) U.S. Cl. .............................. 331/25; 331/11; 327/157; 327/9; 327/12; 327/43; 327/45; 327/49

(58) Field of Classification Search .................... 331/11, 331/25; 327/3, 9, 12, 40, 43, 47–49, 157
See application file for complete search history.

(56) References Cited

U.S. PATENT DOCUMENTS 4,773,085 A * 9/1988 Cordell ........................ 375/375

* cited by examiner

*Primary Examiner*—Robert Pascal
*Assistant Examiner*—James E Goodley
(74) *Attorney, Agent, or Firm*—Kevin A. Reif

(57) ABSTRACT

A stream of data may flow over a fiber or other medium without any accompanying clock signal. The receiving device may then be required to process this data synchronously. Embodiments describe clock and data recovery (CDR) circuits which may sample a data signal at a plurality of sampling points to partition a clock cycle into four phase regions P1, P2, P3, and P4 which may be represented on a phase plane being divided into four quadrants. A relative phase between a data signal transition edge and a clock phase may be represented by a phasor on the phase plane. The clock phase and frequency may be adjusted by determining the instantaneous location of the phasor and the direction of phasor rotation in the phase plane.

7 Claims, 4 Drawing Sheets

(a)

US 7,692,501 B2

PHASE/FREQUENCY DETECTOR AND CHARGE PUMP ARCHITECTURE FOR REFERENCELESS CLOCK AND DATA RECOVERY (CDR) APPLICATIONS

FIELD OF THE INVENTION

Embodiments of the present invention may relate to logic circuits and, more particularly, embodiments of the present invention may relate to clock and data recovery circuits.

BACKGROUND INFORMATION

In many electronic systems, data may be transmitted or retrieved without any timing reference. For example, in optical communications, a stream of data may flow over a fiber without any accompanying clock signal. The receiving device may then be required to process this data synchronously. Therefore, the clock or timing information must be recovered from the data at the receiver using clock and data recovery (CDR) circuits. With the rapid growth of electrical and optical link capability, CDR circuits may require operating at high speeds such as tens of gigabits per second (Gbits/second).

Further, clock and data recovery (CDR) circuits are important for modern transceiver systems to reduce jitter and improve signal quality. Phase-locked-loop (PLL)-based CDR is widely employed in monolithic implementations of continuous-mode CDR circuits. Due to the narrow frequency acquisition range of PLL, most CDR implementations require external reference clock sources. However, when such a reference clock source is not easily available, e.g. in retimer applications, referenceless CDR circuits may be necessary, which can perform both frequency acquisition and phase locking solely based on the incoming data stream.

Several different approaches have been developed to realize referenceless CDR, including dedicated frequency-locking and phase-locking loops, a conditionally closed loop, rotational frequency detectors, half-rate phase and frequency detector (PFD) and V/I converter, and the FD based on transition counting mechanisms.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Figure 1:
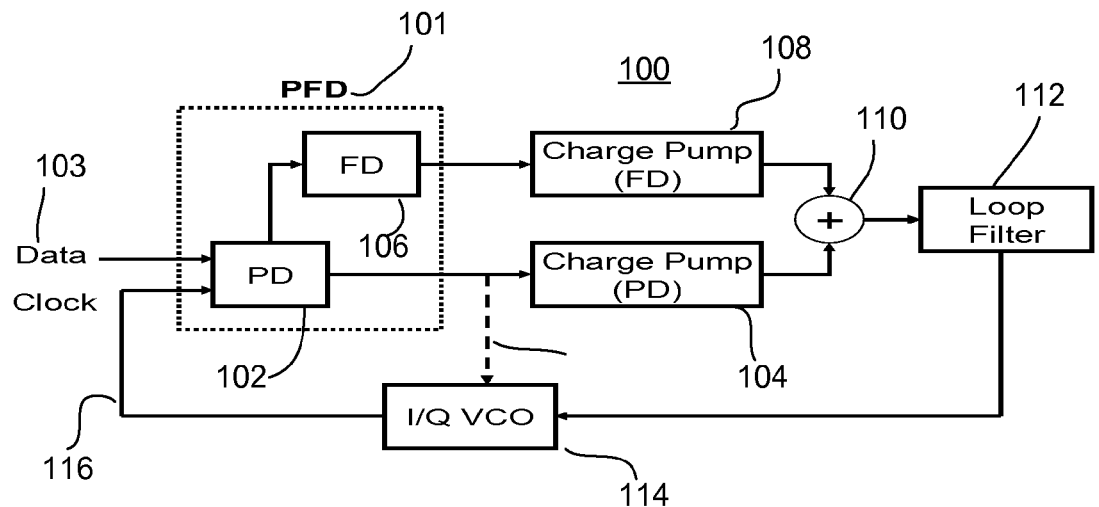
FIG. 1 is a block diagram of a referenceless CDR according to one embodiment of the invention.

In the following detailed description, like reference numerals and characters may be used to designate identical, corresponding or similar components in differing FIG. drawings. Well-known power/ground connections to integrated circuits (ICs) and other components may not be shown within the figures for simplicity of illustration and discussion. Where specific details are set forth in order to describe example embodiments of the invention, it should be apparent to one skilled in the art that the invention can be practiced without these specific details.

Referring no to FIG. 1, there is shown a clock and data recovery (CDR) circuit 100. The CDR circuit 100 includes a phase/frequency detector (PFD) 101, which comprises a self-alignment phase detector (PD) 102 that receives a data signal 103. The PD 102 drives a PD charge pump 104, and a frequency detector (FD) 106 drives an FD charge pump 108. Outputs of the two charge pumps, 104 and 108, are combined at combiner 110 in the current domain to drive a loop filter 112. A voltage-controlled oscillator (VCO) 114, which may be an In-phase and Quadrature VCO (I/Q VCO), provides both in-phase and quadrature clocks 116 for the PD 102, whose oscillation frequency is controlled by the stabilized output voltage of the loop filter 112. The dashed line 116 from the PD 102 to the VCO 114 illustrates the optional implementation of a bang-bang VCO 114.

The proposed PFD structure 101 can incorporate several popular linear-type or bang-bang-type PD structures 101, including the Hogge PD and the Alexander PD. The FD 106 may be a rotational FD that processes the intermediate signals from the PD 102. When the clock frequency deviates from the data rate, the FD 106 and its associate charge pump 108 pulls the VCO 114 frequency towards the data rate. When the frequency is locked, the FD charge pump 108 remains silent so as not to disturb the phase-locking process.

Figure 2A:
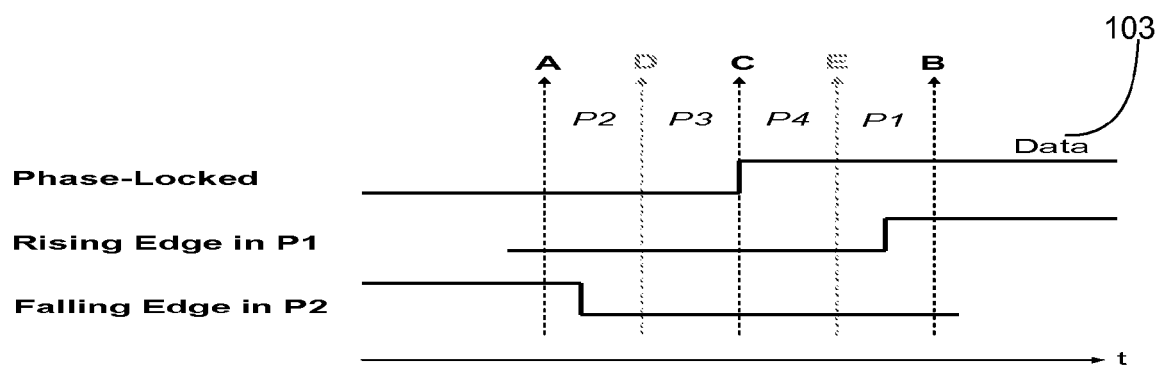
FIG. 2A is a timing diagram of sampling points on the data stream in the time domain.

FIG. 2A shows a timing diagram to illustrate the PFD 101 working principle, in which signals A, B, C, D, and E denote sampling points on the data stream 103. When phase-locked, signals A and B are aligned to centers of data bits, while signal C is aligned to transition edges. Signals B, C, D, and E partition a clock cycle into four phase regions: P1, P2, P3, and P4. By detecting the phase region that the data transition edge falls within, the PFD can determine whether the frequency is locked or not and react accordingly.

Figure 2B:
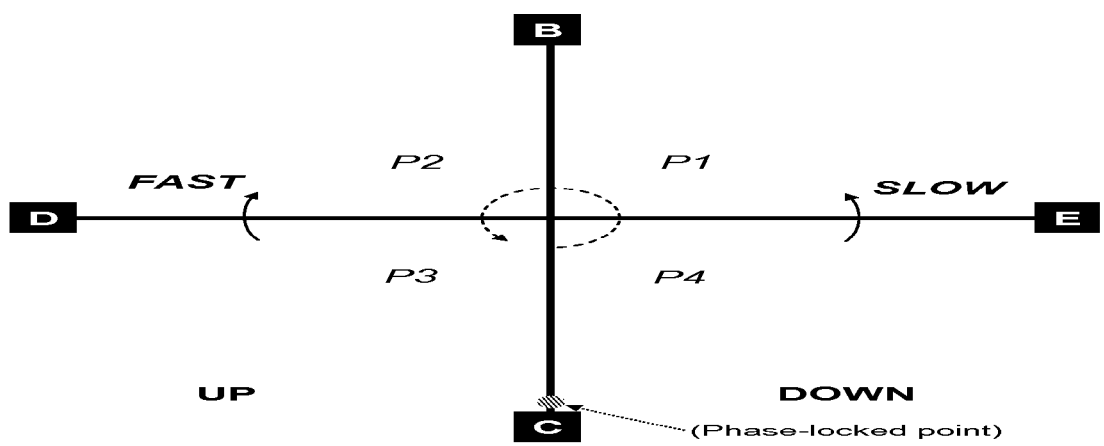
FIG. 2B is a phasor diagram of the same sampling points shown in FIG. 2A in the phase domain.

A phase-domain presentation is shown in FIG. 2B. On the phase plane, a $2\pi$ angle corresponds to a full clock period. The phase-locked point and sampling points B, C, D, and E are labeled on the phase plane. The relative phase between the data transition edge and the clock phase can be represented by a phasor on the phase plane. For a PD 102 to lock phase, it detects if the phasor falls on the left or right planes, and generates signals to drive the VCO 114 frequency up or down, respectively. However, if the clock runs in a different frequency from the data rate, the phasor rotates on the phase plane in a speed equal to the beating frequency.

Figures 3A, 3B:
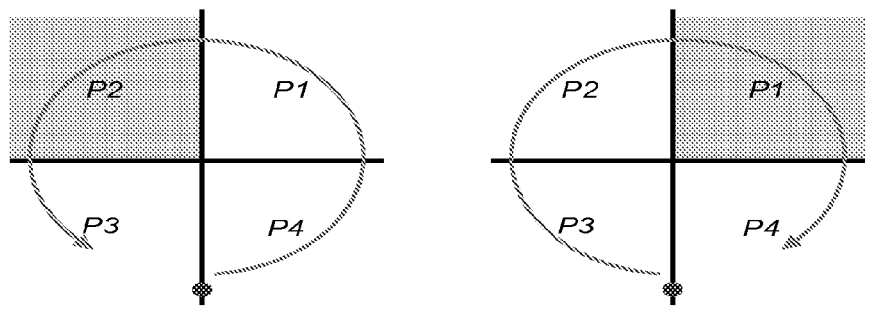
FIGS. 3A and 3B are phasor diagrams illustrating the data transition edge rotation for a conventional FD charge pump when the clock is faster than the data, and slower than the data, respectively.

As illustrated in FIGS. 3A and 3B, a conventional PLL fails to lock either phase or frequency since the PD output is averaged out due to the phasor rotation. Detecting and appropriately reacting to the phasor rotation is a way in which embodiments of the present invention realize frequency detection.

Figure 4A:
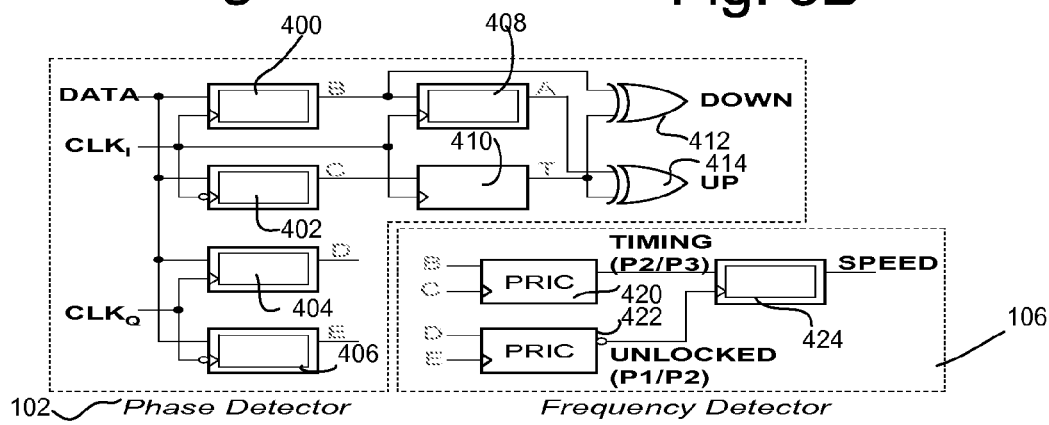
FIG. 4A is a block diagram of one embodiment of the PFD comprising a bang-bang-type Alexander PD.
Figure 4B:
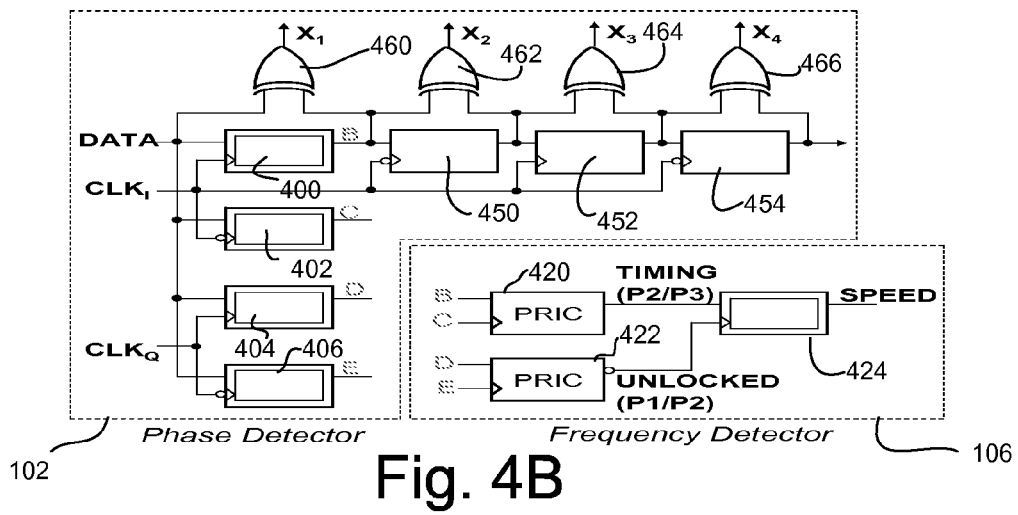
FIG. 4B is a block diagram of another embodiment of the PFD comprising a linear-type tri-wave Hogge PD.

The proposed PFD structure 101, in FIG. 1, includes a PD 102 which may comprise either a conventional Alexander PD as shown in FIG. 4A for bang-bang phase detection, or a tri-wave Hogge PD as shown in FIG. 4B for linear phase detection.

FIG. 4A shows one example of the PFD 101 as shown in FIG. 1, comprising an Alexander PD 102 and a frequency detector 106. Four D-flip-flops (DFF) are shown 400, 402, 404, and 406, each receiving as input the data signal. A first pair of DFFs 400 and 402 are clocked by the in-phase clock signal $CLK_I$ and a second pair of DFFs, 404 and 406 are clocked by the quadrature clock signal $CLK_Q$ from the I/Q VCO 114 (FIG. 1).

In the PD 102, CLKI and CLKQ take samples of DATA to generate signals B, C, D, and E. Signals B and C are input into DFFs 408 and 410, respectively, and clocked by clock signal $CLK_I$. DFF 408 outputs signal A and DFF 410 outputs signal T, where T indicates the "transition". A NOR Gate 412 evaluates signals B and T and outputs a DOWN signal. Similarly, NOR Gate 414 evaluates signals A and T and outputs an UP signal. Intermediate signals B, C, D, and E are then processed by the FD 106 to identify the phase region as well as the relative speed between the clock 116 and the data 103.

The FD 106 comprises two phase-region-identification circuits (PRICs), 420 and 422, and one low-speed DFF 424. PRIC 420 received signals B and C and outputs a timing signal TIMING (P2/P3). PRIC 422 receives signals D and E and outputs and UNLOCKED (P1/P2) signal. DFF 420 receives these two signals and outputs a SPEED signal.

Figure 4C:
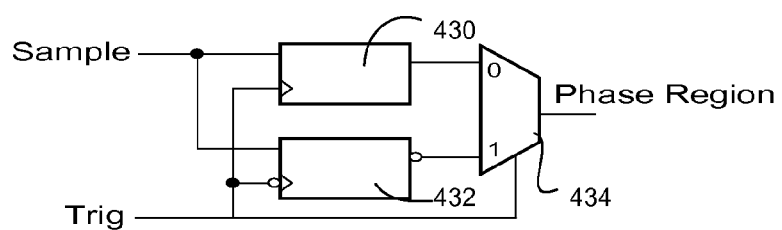
FIG. 4C is a block diagram of a phase-region-identification circuit (PRIC) according to one embodiment.

FIG. 4C shows an exemplary circuitry for PRICs 420 and 422. Each PRIC comprises two DFFs, 430 and 432, and one multiplexer 434. The input of the first DFF 430 may be a sample signal (i.e. signals B, C, D, or E) and a trigger which may be signals B, C, D, or E. The PRIC, 420 and 422, identifies the phase region (P2/P3 or P1/P2 that the instantaneous phasor falls in by taking sample of an older signal upon the transition edge of a newer signal. As a working example, consider the bottom PRIC 422 in FIG. 4A which has signals D and E. If signal E experiences a transition, and the concurrent value of signal D is different from signal E, the transition edge must occur between times when signals D and E are generated. Acquiring the value of signal D upon a falling transition of signal E indicates whether the phasor falls in P3/P4 regions or not. Acquiring the inverted value of signal D upon a rising transition of signal E also provides the same information.

Thus, the PRIC 422 incorporates the non-inverting D-latch 430 and the inverting D-latch 432 triggered by opposite signals to identify the phase region upon both rising and falling edges. The multiplexer 434 always selects the D-latch in the hold mode for output. In the FD, 106 the top PRIC 420 generates the TIMING signal, indicating whether the phasor falls within P2/P3 regions or not. This indicates if the instantaneous data phase leads or lags the clock phase. The bottom PRIC 432 generates the UNLOCKED signal, indicating whether the phasor falls within P1/P2 regions or not. Once the phasor enters either P1 or P2, the loop is not phase-locked. Using the UNLOCKED signal to sample the TIMING signal distinguishes whether the data transition edge transverses across the P3-P2 or P4-P1 boundaries, leading to the SPEED signal. The generated TIMING, UNLOCKED, and SPEED signals drive the FD charge pump (108 from FIG. 1) to perform frequency locking.

FIG. 4B shows a another example of the PFD 101 as shown in FIG. 1, comprising a tri-wave Hogge PD 102 and a frequency detector 106. Similar to FIG. 4A, four D-flip-flops (DFF) are shown 400, 402, 404, and 406, each receiving as input the data signal. A first pair of DFFs 400 and 402 are clocked by the in-phase clock signal $CLK_I$ and a second pair of DFFs, 404 and 406, are clocked by the quadrature clock signal $CLK_Q$ from the I/Q VCO 114 (FIG. 1).

In the PD 102, $CLK_I$ and $CLK_Q$ take samples of DATA to generate signals B, C, D, and E. Signal B from DFF 400 is input into latch 450. The output of latch 450 is input into latch 452 and the output of latch 452 is input into latch 454. Latches 450, 452, and 454 are clocked by clock signal $CLK_I$. A first XOR gate 460 evaluates signal B and the DATA signal and outputs signal x1. XOR gate 462 evaluates signal B with the output of latch 450 and outputs signal x2. XOR gate 464 evaluates the output of latches 450 and 452 and outputs signal x3 and XOR gate 466 evaluates the outputs of latches 452 and 454 to output signal x4.

This triwave Hogge PD generates four output signals x1-x4, two for UP and two for DOWN, similar to UP and DOWN in FIG. 4A. Each transition edge of the incoming data stream induces x1-x4 signals sequentially. When there is phase offset between data and clock, these signals result in a net charging up or down to the loop filter 112. In steady-state operation, when phase-locked, their pulse widths are all equal and thus cancel each other, nominally pumping zero net charge into a loop filter capacitor.

Figure 5A:
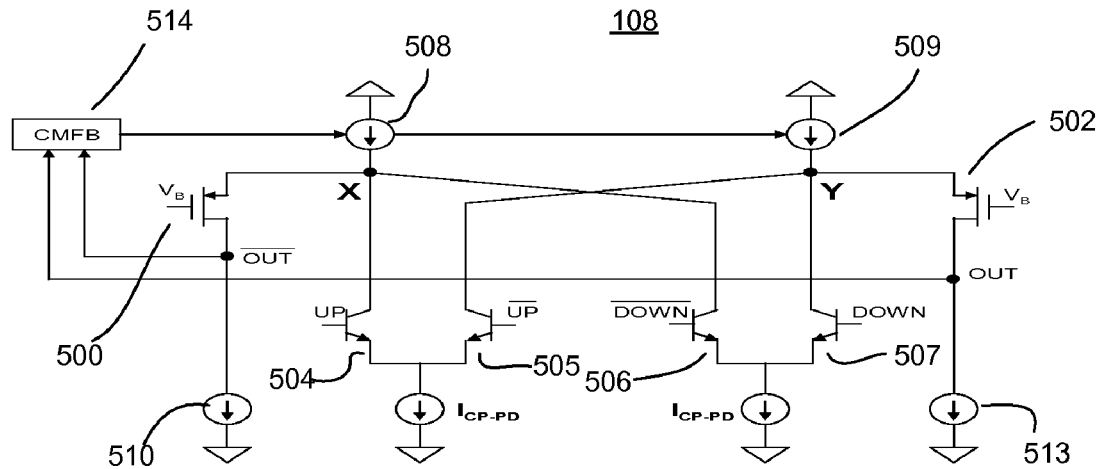
FIG. 5A is a circuit diagram of a PD charge pump according to one embodiment.

FIG. 5A shows the PD charge pump 108 from FIG. 1. The PD charge pump 108 comprises PMOS cascode at the output nodes to broaden the output voltage range, and the low-impedance nodes X and Y allow the FD charge pump 108 to tap in or connect to. The cascode PMOS 500, 502 and current sources 508, 509, 510, 513 in FIG. 5A effectively function as the current summer 110 in FIG. 1. Nodes X and Y are the input nodes to the current summer. So FD charge pump and PD charge pump are connected at these nodes.

The PD Charge pump 108 is based on a conventional differential charge pump. When "UP" is high and "DOWN" is low, the differential pair 504, 505 drains a current of $I_{CP-PD}$ from node X, and the differential pair 506, 507 also drains a current of $I_{CP-PD}$ from node X. This $2 \times I_{CP-PD}$ current draining from node X results in a voltage decrease at node $\overline{OUT}$ and a voltage increase at node OUT due to the common mode feedback (CMFB) circuit 514 which keeps track of output voltages and sets their common-mode voltage to a predefined voltage level. On the other hand, when "UP" is low and "DOWN" is high, it drains a current of $2 \times I_{CP-PD}$ from node Y, leading to a voltage decrease at node OUT and a voltage increase at node $\overline{OUT}$ due to CMFB. When both "UP" and "DOWN" are low, or when both are high, it drains equal amounts of current from nodes X and Y, leaving the output voltages unchanged.

Figure 5B:
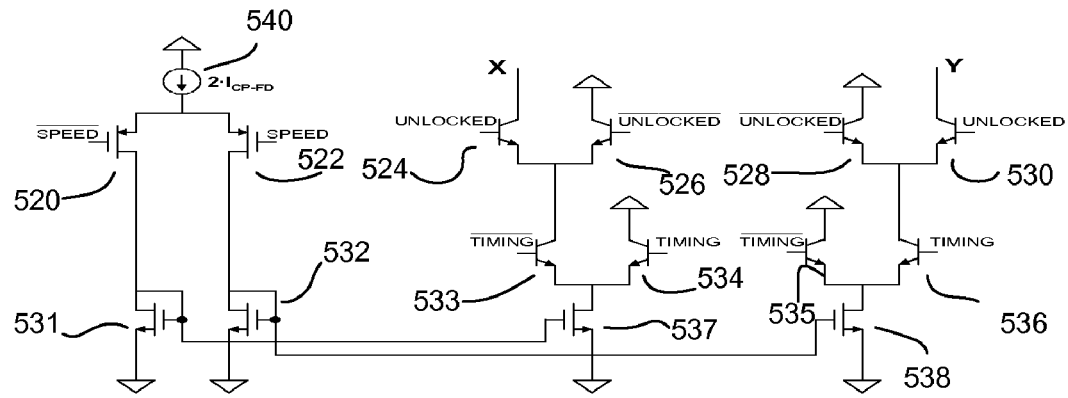
FIG. 5B is a circuit diagram of a FD charge pump using current mirrors according to one embodiment.
Figure 5C:
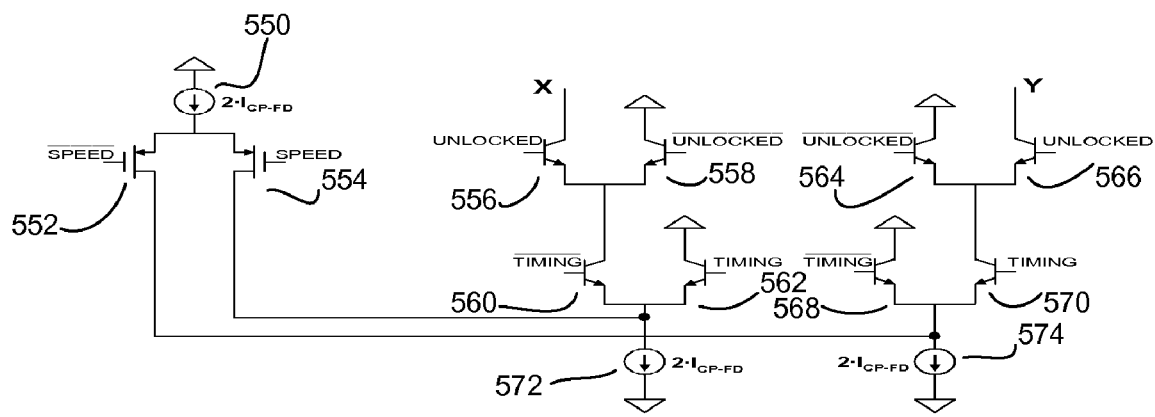
FIG. 5C is a circuit diagram of a FD charge pump using a current starving technique according to another embodiment.

FIGS. 5B and 5C show two proposed realizations of tri-state FD charge pumps 104, from FIG. 1.

Referring now to FIG. 5B, a first embodiment of the tri-state FD charge pump 104 comprises a differential pair 520, 522 and current mirrors 531, 537 and 532, 538 to deliver a tail current of $2 \times I_{CP-FD}$. When SPEED is high, transistor 537 is driven to sink a current of $2\times I_{CP\text{-}FD}$, while transistor 538 sinks zero current. The cascaded differential pairs 524, 526 and 533, 534 perform logic AND operation to select the phase region P1 such that the charge pump drains a current of $2\times I_{CP\text{-}FD}$ from the X node only when the phasor falls within P1. On the other hand, when SPEED is low, transistor 537 is driven to sink zero current, while transistor 538 sinks a current of $2\times I_{CP\text{-}FD}$. The cascaded differential pairs 528, 530 and 535, 536 perform logic AND operation to select the phase region P2 such that the charge pump drains a current of $2\times I_{CP\text{-}FD}$ from the Y node only when the phasor falls within P2.

Referring now to FIG. 5C, a second embodiment of the tri-state FD charge pump 104 comprises a differential pair 552, 554 to draw a current of $2\times I_{CP\text{-}FD}$ to starve tail current sources 572 or 574. When SPEED is high, it draws a current of $2\times I_{CP\text{-}FD}$ to starve tail current source 574, while drawing none from tail current source 572. The differential pairs 556, 558 and 560, 562 performs logic AND operation to select the phase region P1 such that the charge pump drains a current of $2\times I_{CP\text{-}FD}$ from the X node only when the phasor falls within P1. On the contrary, when SPEED is low, tail current source 572 is starved. The cascaded differential pairs 564, 566 and 568, 570 perform logic AND operation to select the phase region P2 such that the charge pump drains a current of $2\times I_{CP\text{-}FD}$ from the Y node only when the phasor falls within P2.

Either FD charge pump from FIGS. 5B or 5C may be adopted in the CDR loop. The FD charge pumps 108 are conditionally active only within either P1 or P2, shown as gray areas in FIGS. 3A and 3B. Specifically, it performs logic AND operations on UNLOCKED and TIMING signals to find single phase regions P1 and P2, and uses the SPEED signal to select the current-draining path. The circuit in FIG. 5B employs current mirrors to select the current-draining path, while the circuit in FIG. 5C uses the current-starving technique to execute the same function.

The FD charge pump 108 drains current only when the phasor falls in the gray regions in FIGS. 3A and 3B. This ensures the FD charge pump 108 to remain silent when the loop is phase-locked, since the phasor falls within P3/P4 regions when phase-locked. It is worth noting that the logic AND operations can also be realized in the FD, i.e. instead of TIMING and UNLOCKED signals, the FD 106 can generate signals corresponding to single phase regions P1 and P2 to drive the FD charge pump 108. However, exploiting the charge pump to perform the logic AND operations does not consume extra power, and it allows the FD 106 to operate in relatively slower speeds to further reduce power consumptions. In the FD charge pump 108, placing the UNLOCKED signals on the upper differential pairs and the TIMING signals on the lower pairs minimizes parasitic coupling from the FD 106 to the charge pump output in the phase-locked condition. During frequency locking, the FD charge pump 108 continues to remain active when the phasor falls within the designated phase regions, resulting in large FD 106 gains. This helps achieve fast frequency locking and ensures FD path dominance during the frequency acquisition process.

Figure 6:
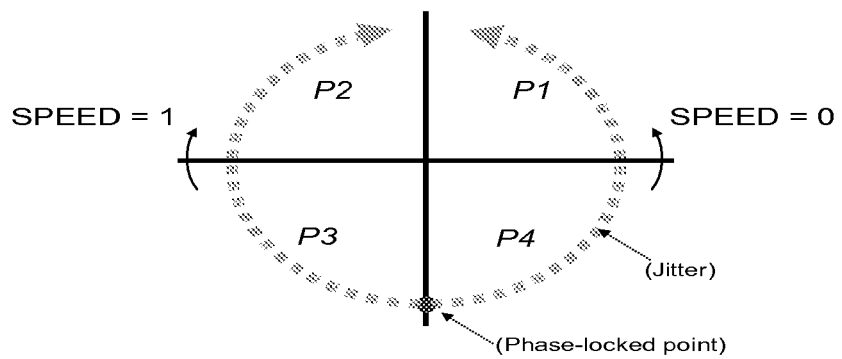
FIG. 6 is a phasor diagram illustrating FD response in the presence of random jitters when phase locked.

In presence of random jitters, the FD path remains silent when the relative phase between the incoming data and the recovered clock does not exceed ±0.5 UI, as illustrated in FIG. 6. This is because only when the phasor transverses across the P1-P2 boundary will the FD charge pump 108 be activated. It maintains the maximum jitter tolerance achievable by the conventional PD 102 in a PLL-based CDR circuit. The proposed PFD 101 may need extra power beyond conventional PDs to realize frequency acquisition. However, most of the additional power consumption is due to the extra DFFs of the proposed PD 102. The power consumption of the FD 106 is lower than the PD 102 since the FD 106 output signals run in relatively low speeds relative to the data rate. Compared conventional designs, the proposed design achieves effective frequency acquisition capability with modest power consumption.

Figure 7A:
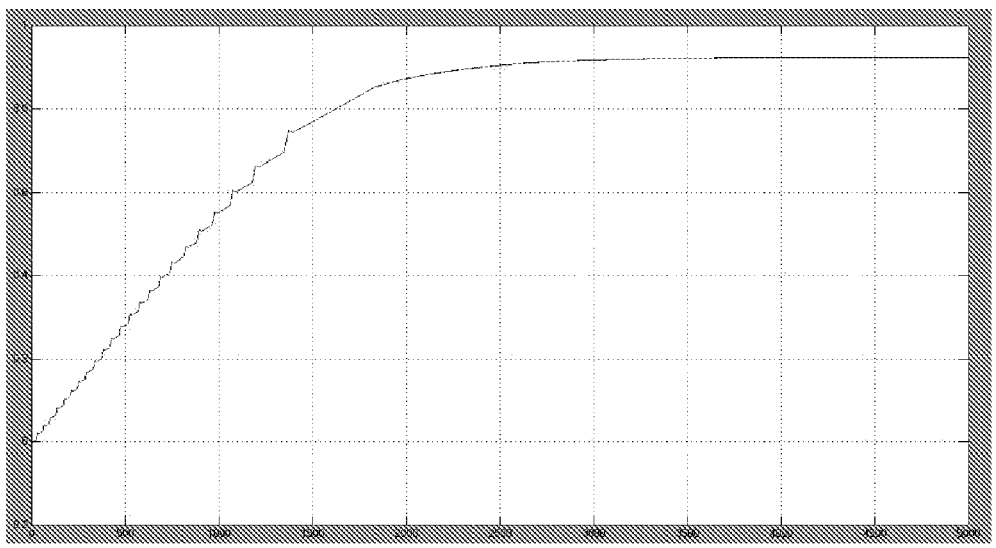
FIG. 7A is a diagram of a computer simulation of VCO control during the frequency and phase locking process of a bang-bang CDR loop.

FIG. 7A presents the simulation result for the CDR loop behavior during frequency and phase locking processes. The initial clock frequency is slower than the data rate. The VCO control voltage exhibits a ladder-like curve during the frequency locking process, in which the steep rising edges correspond to the FD charge pump 108 actions within P1. Gradually, the period between adjacent P1 durations becomes longer and longer, indicating slower and slower phasor rotation on the phase plane. Eventually, when the frequency deviation becomes small enough, the FD charge pump 108 remains silent, and the loop performs phase locking in exactly the same way as a conventional PLL.

Figure 7B:
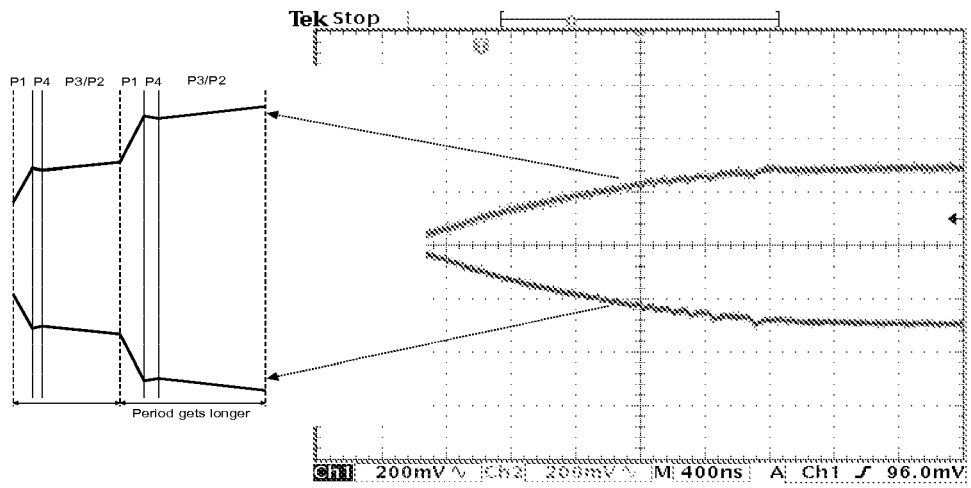
FIG. 7B is a diagram of VCO control during the frequency and phase locking process of a bang-bang CDR loop measuring $V_{cntrl}+$ and $V_{cntrl}-$ with a test chip.

FIG. 7B shows the measurement result, which agrees with the behavior-model simulation. The top and bottom curves correspond to charge pump output voltages OUT and $\overline{\text{OUT}}$, respectively, during frequency/phase locking. The behavior model simulation in FIG. 7A shows the differential output voltage, which is the difference between OUT and $\overline{\text{OUT}}$. The measurement result clearly demonstrates the phase region transversal in the sequence of P1-P4-P3-P2, corresponding to a clockwise phasor rotation on the phase plane. The PFD 101 and the FD charge pump 108 deliver extra current pulses during P1 in order to drive the VCO 114 speed up. If without the proposed PFD 101 and FD charge pump 108, the net effect of the PD charge pump 104 during P1-P4-P3-P2 will be zero when frequency offset is large, resulting in failure of frequency locking in conventional PLL-based CDR circuit. The steep rising/falling edges on the curves demonstrate the PFD 101 and FD charge pump's 108 behaviors.

Compared to conventional designs, the present invention is a relatively simple and effective approach. It employs a self-alignment phase detector (PD), avoids loop swapping, consumes small extra power and die area for frequency acquisition, and maintains the maximum jitter tolerance achievable by its PLL counterpart.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An optical communication system including a clock and data recovery circuit, comprising:
   a phase detector to receive as input a data signal and a clock signal, the phase detector to sample the data signal at a plurality of sampling points to partition a clock cycle into four phase regions P1, P2, P3, and P4, the phase detector further to determine in which phase region a date transition edge occurs to generate an UP or DOWN signal to adjust clock signal phase;

a frequency detector to generate a TIMING signal if the data transition edge traverses a P2/P3 boundary and a UNLOCKED signal if the data transition edge traverses a P1/P2 boundary, the frequency detector further comprising a latch receiving as an input the TIMING signal and latched by the UNLOCKED signal to produce a SPEED signal, the TIMING signal, the UNLOCKED signal and the SPEED signal used to adjust clock signal frequency.

2. The optical communication system as recited in claim 1, further comprising:
a phase detector charge pump driven by the UP signal and the DOWN signal.

3. The optical communication system as recited in claim 2, further comprising:
a frequency detector charge pump driven by the TIMING signal, the UNLOCKED signal and the SPEED signal.

4. The communication system as recited in claim 3, further comprising:
a combiner for combining an output of the phase detector charge pump and an output of the frequency detector charge pump; and
a voltage controlled oscillator (VCO) receiving an output of the combiner to output the clock signal.

5. The communication system as recited in claim 4 wherein the phase detector comprises a bang-bang type Alexander phase detector.

6. The communication system as recited in claim 4 wherein the phase detector comprises a tri-wave Hogge phase detector.

7. The communication system as recited in claim 4 wherein the frequency detection charge pump is conditionally active when the data transition edge falls in phase region P1 or P2.

* * * * *